United States Patent [19]

Slezak et al.

[11] Patent Number: 5,696,730
[45] Date of Patent: Dec. 9, 1997

[54] FIRST READ CYCLE CIRCUIT FOR SEMICONDUCTOR MEMORY

[75] Inventors: Yaron Slezak, Kiriat Motzkin; Boaz Eitan, Ra'anana, both of Israel

[73] Assignee: Waferscale Integration Inc., Fremont, Calif.

[21] Appl. No.: 665,191

[22] Filed: Jun. 13, 1996

[51] Int. Cl.$^6$ .................................................... G11C 7/00
[52] U.S. Cl. ...................... 365/227; 365/195; 365/194; 365/189.09; 365/189.07; 365/233.5
[58] Field of Search ...................... 365/195, 194, 365/189.09, 227, 189.07, 233.5

[56] References Cited

U.S. PATENT DOCUMENTS 5,345,424  9/1994  Landgraf ..................... 365/227

*Primary Examiner*—David C. Nelms
*Assistant Examiner*—Andrew Q. Tran
*Attorney, Agent, or Firm*—Skjerven, Morrill, MacPherson, Franklin & Friel

[57] ABSTRACT

A novel circuit for initiating a first read cycle when power is first applied to the memory device is disclosed. The circuit compares the ramping up of the word line voltage signal to a stable reference voltage using a comparator. Once the word line voltage reaches a predetermined level, but before it reaches its maximum value, the comparator trips. The transition of the comparator output is sensed by an address transition detection circuit which subsequently triggers a read cycle of the memory, thus creating a dummy read access without any requirement that the input address actually make a transition. A memory access time later, valid data is available at the output of the memory array. A voltage divider is used to divide the word line voltage to a suitable level for input to the comparator. The stable reference voltage serves as the source of the word line signal, besides being input to the comparator. A voltage multiplier is utilized to generate the word line signal from the voltage reference. Alternatively, the word line voltage may be supplied by an external source such as the supply voltage. Both the voltage multiplier and the voltage divider include programmable trimming transistors which allow tuning of their respective outputs. In addition, enable circuitry is included which disables the first read cycle circuitry in order to reduce power consumption after the first read cycle is initiated.

21 Claims, 7 Drawing Sheets

1

FIRST READ CYCLE CIRCUIT FOR SEMICONDUCTOR MEMORY

FIELD OF THE INVENTION

The present invention relates generally to nonvolatile semiconductor memory (NVM) devices and more particularly relates to circuitry for generating clock timing signals for the initial read cycle of a memory array.

BACKGROUND OF THE INVENTION

Many semiconductor memory devices today typically are asynchronous in operation, from the perspective of the user. In other words, a user need not supply a clock signal to these devices in order to read data out of them. Internally, however, most of these memory devices operate synchronously with the necessary clock signals being self generated. High to low or low to high transitions on any individual input address line trigger the generation of clock signals for the initiation of a new read cycle. A problem, however, exists as to how to generate the first or initial read cycle which occurs immediately upon power being applied to the memory device. Valid address data may be input to the device upon power up but an address transition is lacking which is necessary to trigger the initiation of a read cycle.

From the standpoint of a user, it is not acceptable to ignore a valid address input to the memory device at the moment power is first applied. In operation of the memory device, it is essential that valid output data be provided at power up even though a transition on one or more of the address lines does not occur.

One solution to the first read cycle problem is to utilize a time delay mechanism after power up to trigger the first read cycle. The problem with this approach is that the power supply voltage signal and the signals within the chip are not well defined as the power supply voltage ramps up from zero to full value. Thus, using a time delay mechanism to trigger the first read cycle is not very reliable.

Another constraint involving any circuit that triggers an initial read cycle is that there must be sufficient read current generated in the memory array to guarantee that the data output by the device is valid. If the supply voltage is not high enough yet, insufficient read current is generated and there is not guarantee that the output data is valid.

Yet another constraint involves the relationship between the word line voltage and the signal development in the memory array. In a memory device, the cell read time depends strongly on the voltage level of the word line signal. As the word line voltage level drops, the signal development time increases. Clocked memory designs must take this fact into account in generating any output data from the memory array.

SUMMARY OF THE INVENTION

Accordingly, it is an object of the present invention to provide first read cycle circuitry able to generate a valid read cycle at power up without requiring the occurrence of an address transition on the input address lines.

Another object of the present invention is to provide first read cycle circuitry wherein the output data of the memory array is valid before the supply voltage reaches its full value.

Yet another object of the present invention is to provide first read cycle circuitry wherein the first read cycle is triggered, not as a function of the power-up ramp rate, but as a function of the supply voltage passing a predetermined threshold so as to guarantee the validity of the output data from the memory array.

Another object of the present invention is to provide first read cycle circuitry wherein the voltage level of the word line and the voltage level of the comparator trip point track each other in variations in process and temperature.

A circuit for initiating a first read cycle when power is first applied to the memory device is disclosed. The circuit compares the ramping up of the word line voltage signal to a stable reference voltage using a comparator. Once the word line voltage reaches a predetermined level, but before it reaches its maximum value, the comparator trips. The transition of the comparator output is sensed by an address transition detection circuit which subsequently triggers a read cycle of the memory, thus creating a dummy read access without any requirement that the input address actually make a transition. A memory access time later, valid data is available at the output of the memory array. A voltage divider is used to divide the word line voltage to a suitable level for input to the comparator. The stable reference voltage serves as the source of the word line signal, besides being input to the comparator. A voltage multiplier is utilized to generate the word line signal from the voltage reference. Alternatively, the word line voltage may be supplied by an external source such as the supply voltage. Both the voltage multiplier and the voltage divider include programmable trimming transistors which allow tuning of their respective outputs. In addition, enable circuitry is included which disables the first read cycle circuitry in order to reduce power consumption after the first read cycle is initiated.

In accordance with a preferred embodiment of the present invention, there is provided a latched memory array circuit utilizing a sense amp delay circuit, a supply voltage, a reference voltage, a reference voltage valid signal, a word line signal and clock chain circuitry, a circuit for initiating a read cycle within the memory array circuit upon the initial application of power by generating an output signal active to trigger the clock chain circuitry to initiate a read cycle within the memory array circuit, the circuit comprising a comparator having first and second inputs and an output, the reference voltage coupled to the first input, the word line signal coupled to the second input, the comparator being enabled when the reference voltage valid signal goes active, the output of the comparator being tripped when the word line signal exceeds the reference voltage, clocking means having an input and an output, the output of the comparator coupled to the input of the clocking means, the output of the clocking means coupled to the clock chain circuitry, wherein the reference voltage is chosen such that the tripping of the comparator occurs before the word line signal reaches its full value, the word line signal input to the sense amp delay circuit, the sense amp delay circuit delaying the availability of output data from the memory array circuit in accordance with the level of the word line signal, and wherein the tripping of the comparator is not dependent on the ramping up of the supply voltage and causes the clock means to trigger the clock chain circuitry to initiate a read cycle of the memory array circuit thus providing valid data.

The circuit further comprising enable circuitry coupled to the output of the comparator, the enable circuitry disabling the output of the comparator while a reference voltage valid signal indicates that the reference voltage is invalid. In Addition, the comparator comprises an enable circuit, whereby the tripping of the comparator causes the disablement of the comparator after a predetermined time delay, thus reducing power consumption of the circuit. Further, the clock means comprises address transition detection circuitry.

There is also provided, in accordance with a preferred embodiment of the present invention, a memory array circuit utilizing a sense amp delay circuit, a supply voltage, a reference voltage, a reference voltage valid signal, a word line signal and clock chain circuitry, a circuit for initiating a read cycle within the memory array circuit upon the initial application of power by generating an output signal active to trigger the clock chain circuitry to initiate a read cycle within the memory array circuit, the circuit comprising a voltage divider having an input and an output, the word line signal coupled to the input, a comparator having first and second inputs and an output, the reference voltage coupled to the first input, the output of the voltage divider coupled to the second input, the comparator being enabled when the reference voltage valid signal goes active, the output of the comparator being tripped when the output of the voltage divider exceeds the reference voltage, clock means having an input and an output, the output of the comparator coupled to the input of the clock means, the output of the clock means coupled to the clock chain circuitry, wherein the voltage divider is suitably tuned such that the tripping of the comparator occurs before the word line signal reaches its full value, the word line signal input to the sense amp delay circuit, the sense amp delay circuit delaying the availability of output data from the memory array circuit in accordance with the level of the word line signal, and wherein the tripping of the comparator is not dependent on the ramping up of the supply voltage and causes the clock means to trigger the clock chain circuitry to initiate a read cycle of the memory array circuit thus providing valid data.

There is also provided, in accordance with a preferred embodiment of the present invention a memory array circuit utilizing a sense amp delay circuit, a supply voltage, a reference voltage, a reference voltage valid signal, a word line signal and clock chain circuitry, a circuit for initiating a read cycle within the memory array circuit upon the initial application of power by generating an output signal active to trigger the clock chain circuitry to initiate a read cycle within the memory array circuit, the circuit comprising a multiplier having an input and an output, the input of the multiplier coupled to the reference voltage, a comparator having first and second inputs and an output, the word line signal coupled to the first input of the comparator, the output of the multiplier coupled to the second input of the comparator, the comparator being enabled when the reference voltage valid signal goes active, the output of the comparator being tripped when the word line signal exceeds the output of the multiplier, clock means having an input and an output, the output of the comparator coupled to the input of the clock means, the output of the clock means coupled to the clock chain circuitry, wherein the multiplier is suitably tuned such that the tripping of the comparator occurs before the word line signal reaches its full value, the word line signal input to the sense amp delay circuit, the sense amp delay circuit delaying the availability of output data from the memory array circuit in accordance with the level of the word line signal, and wherein the tripping of the comparator is not dependent on the ramping up of the supply voltage and causes the clock means to trigger the clock chain circuitry to initiate a read cycle of the memory array circuit thus providing valid data.

There is further provided, in accordance with a preferred embodiment of the present invention a memory array circuit utilizing a sense amp delay circuit, supply voltage, a reference voltage, a reference voltage valid signal, a word line signal and clock chain circuitry, a method of initiating a read cycle within the memory array circuit upon the initial application of power, the method comprising the steps of comparing the reference voltage to the word line signal once the reference voltage valid signal goes active, upon the word line signal exceeding the reference voltage, generating an output signal active to trigger the clock chain circuitry to initiate a read cycle within the memory array circuit, wherein the step of generating is not dependent on the ramping of the supply voltage, and wherein the sense amp delay circuit delays the availability of output data from the memory array circuit in accordance with the level of the word line signal.

There is also provided, in accordance with a preferred embodiment of the present invention a memory array circuit utilizing a sense amp delay circuit, a supply voltage, a reference voltage, a reference voltage valid signal, a word line signal and clock chain circuitry, a method of initiating a read cycle within the memory array circuit upon the initial application of power, the method comprising the steps of dividing the word line signal, comparing the reference voltage to the divided word line signal once the reference voltage valid signal goes active, upon the divided word line signal exceeding the reference voltage, generating an output signal active to trigger the clock chain circuitry to initiate a read cycle within the memory array circuit, wherein the step of generating is not dependent on the ramping up of the supply voltage, and wherein the sense amp delay circuit delays the availability of output data from the memory circuit in accordance with the level of the word line signal.

There is further provided, in accordance with a preferred embodiment of the present invention a memory array circuit utilizing a sense amp delay circuit, a supply voltage, a reference voltage, a reference voltage valid signal, a word line signal and clock chain circuitry, a method of initiating a read cycle within the memory array circuit upon the initial application of power, the method comprising the steps of multiplying the reference voltage, comparing the multiplied reference voltage to the word line signal once the reference voltage valid signal goes active, upon the word line signal exceeding the multiplied reference voltage, generating an output signal active to trigger the clock chain circuitry to initiate a read cycle within the memory array circuit, wherein the step of generating is not dependent on the ramping up of the supply voltage, and wherein the sense amp delay circuit delays the availability of output data from the memory circuit in accordance with the level of the word line signal.

BRIEF DESCRIPTION OF THE DRAWINGS

The invention is herein described, by way of example only, with reference to the accompanying drawings, wherein.

DETAILED DESCRIPTION OF THE INVENTION

Figure 1:
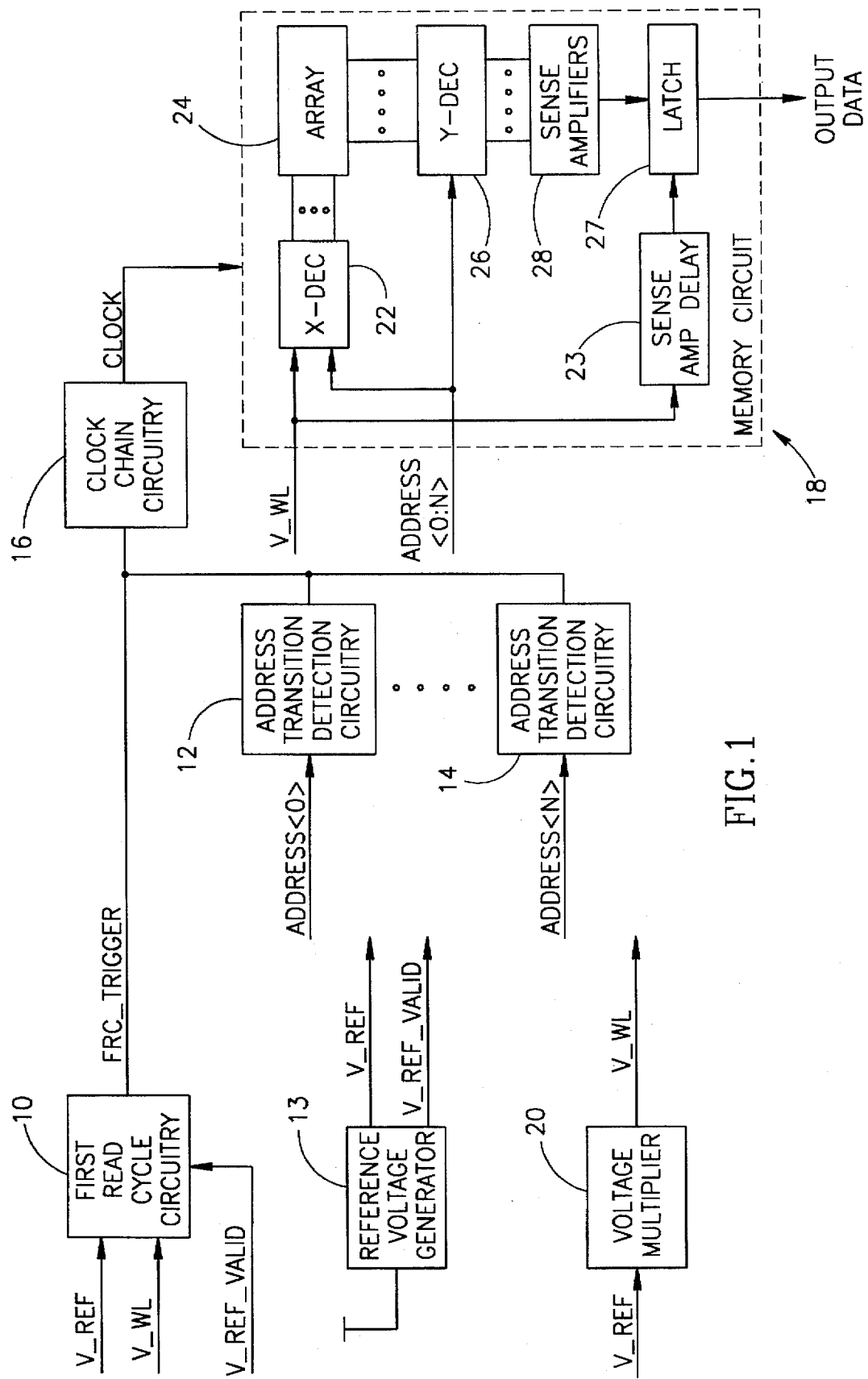
FIG. 1 is a high level block diagram illustrating the first read cycle circuitry of the present invention applied to a sample semiconductor memory circuit.

A high level block diagram illustrating the first read cycle circuitry, generally referenced 10, of the present invention applied to a sample semiconductor memory circuit is shown in FIG. 1. The first read cycle circuitry 10 functions as a trigger to clock chain circuitry 16 when power is first applied to the memory integrated circuit. Many memory devices such as ROMs, EPROM and EEPROMs are accessed asynchronously, meaning the user need not provide a clock signal to the device. Not receiving an external clock signal, these devices must generate a clock signal internally because their internal memory array circuits are driven synchronously. The clock chain circuitry 16 provides the timing signals for accessing data from a memory circuit 18. Memory circuit 18 comprises an X-decoder 22, the actual memory array itself 24, Y-decoder 26, sense amplifiers 28, sense amp delay circuit 23 and latch 27. The address lines are input to the X-decoder and the Y-decoder. The word line voltage V_WL is input to the X-decoder and to sense amp delay circuit 23.

The clock chain circuitry is normally triggered by a transition on any of the input address lines. Address transition detection circuitry 12, 14 function to sense a transition on their respective address lines and trigger clock chain 16, thus generating a read access. The address transition detection circuitry illustrated in FIG. 1 is for illustrative purposes only and is not meant to limit the scope of the present invention. Any suitable clocking means that is able to generate a clock trigger signal from an input will work in the present invention. Each address line from address bit 0 to address bit N is coupled to an individual address transition detection circuit. The output signal, labeled FRC_TRIGGER, of the first read cycle circuitry 10 triggers the clock chain in the same manner as the address transition detection circuits 12, 14. Once the clock chain is triggered, the proper clock timing signals are generated for accessing data from the memory array. An access time period later, the data corresponding to the input address is available at the output data port.

The first read cycle circuitry receives as input the following signals, a voltage reference V_REF, a signal indicating that the voltage reference is valid V_REF_VALID and the word line voltage V_WL. The reference voltage V_REF and the valid indicator signal V_REF_VALID are generated by a reference voltage generator 13. In a preferred embodiment, V_REF is a bandgap reference voltage which is stable against fluctuations in temperature and voltage supply. The V_REF_VALID signal is not active until the V_REF signal has stabilized at its steady state value of approximately 1 V. The word line voltage signal V_WL is used to access data within the memory circuit 18. The word line signal actually acts as a voltage supply for the word line signal used in the memory array. A voltage multiplier 20 functions to generate V_WL. The word line voltage is generated by multiplying V_REF by approximately 4.5. Multiplying by other values would also work without departing from the essence of the present invention.

The first read cycle circuitry operates by comparing the reference voltage V_REF with the word line voltage V_WL. When the V_WL signal reaches a predetermined level, the first read cycle trigger, FRC_TRIGGER, is generated which initiates a read cycle (i.e., a dummy read cycle) in the memory array and subsequently, output data is available an access time later. Thus, the first read cycle only occurs when the word line signal voltage, V_WL, is high enough to generate valid data from the memory array. In addition, valid data is output from the memory array before the supply voltage reaches its full value. To achieve this, the sense amplifier delay must be delayed in proportion to the word line voltage. This function is performed by the sense amp delay circuit 23. Sense amp delay circuit 23 can be any suitable delay circuit that controls the latching of the data from the sense amplifiers 28 by latch 27 in accordance with the word line voltage level. For latched designs, the output data should not be latched until it is guaranteed that valid data exists at the output of the sense amplifiers 28. If the sense amp delay is too short, invalid data will be latched by latch 27. Thus, the delay imposed by the sense amp delay circuit must be a function of the word line voltage. For lower values of the word line, the delay is correspondingly longer. Longer delays are needed to compensate for the longer signal development time in the array 24. A sense amp delay circuitry 23 is described in detail in similarly assigned co-pending application entitled Self Adjusting Sense Amplifier Clock Delay Circuit.

Figure 2:
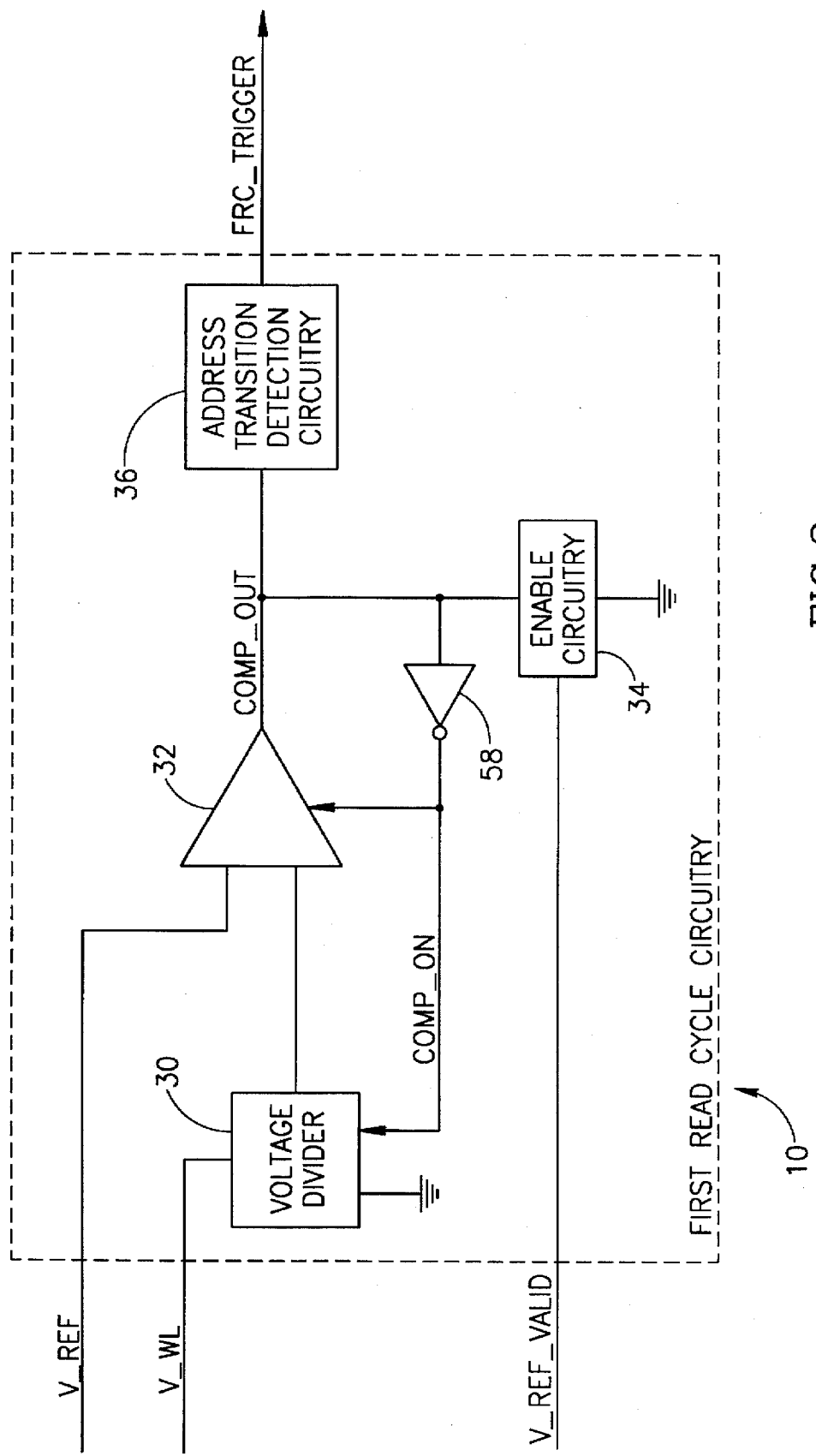
FIG. 2 is a high level functional block diagram illustrating the first read cycle circuitry constructed in accordance with a preferred embodiment of the present invention.

The first read cycle circuitry will now be described in more detail. A high level functional block diagram illustrating the first read cycle circuitry constructed in accordance with a preferred embodiment of the present invention is shown in FIG. 2. First read cycle circuitry 10 comprises a voltage divider 30, comparator 32, inverter 58, enable circuitry 34 and address transition detection circuitry 36. A key element of the present invention is comparator 32 which functions to generate the 'dummy' transition which, in turn, causes the address transition detection circuitry 36 to trigger clock chain 16 (FIG. 1) which initiates the first read cycle.

The word line voltage V_WL is input to a voltage divider 30 which is preferably set to divide its input voltage by 4. Note that the voltage divider setting of 4 is not the reciprocal of the voltage multiplier 20 (FIG. 1) setting of 4.5. If a voltage multiplier setting other than 4.5 is used than voltage divider 30 preferably should also be suitably changed as described below. Preferably, the maximum voltage level chosen for the trip point of the comparator should be the supply voltage minus a small delta. The minimum voltage level for the trip point of the comparator can be as low as desired so long as the sense amp delay circuit 23 (FIG. 1) can still track the signal development in the array 24. The preferred value of 4 V was chosen so that a minimum amount of delay need be added to the access time in order to obtain reliable output data yet the data will be ready before the supply voltage reaches its final value.

As described above, in a preferred embodiment of the present invention, a voltage of at least 4 V is applied to the memory array. Thus, the first dummy read cycle can be generated when the word line voltage has only reached a value of 4 V. The output of voltage divider 30 comprises one of the inputs to comparator 32. The other input to comparator 32 is the voltage reference V_REF. Thus, the comparator will trip when the word line voltage reaches 4 V. In addition, the comparator trip point is self adjusting in that the bandgap reference voltage which controls the trip point of the comparator also is used to generate the word line signal V_WL. Another reason for setting the trip point of the comparator to 4 V rather than the full 4.5 V of the steady state word line voltage is to guarantee that the comparator will trip upon power up of the device. Since the steady state value of the word line is higher than 4 V it is guaranteed that it will cross the 4 V level.

When the word line voltage exceeds 4 V, the comparator trips and its output COMP_OUT transitions from a 0 to a 1. The COMP_OUT signal is input to address transition detection circuitry 36 and inverter 58. Enable circuitry 34 initially pulls the COMP_OUT signal down until V_REF is valid. Enable circuitry also functions to clamp the COMP_OUT signal high when the comparator and voltage divider are disabled. To conserve energy and reduce power consumption, using inverter 58, the voltage divider and comparator are shut off after the comparator has tripped. Inverter 58 also functions to provide sufficient delay before shutting off the voltage divider and the comparator. Depending on the actual circuit, more than one inverter might need to be inserted to provide sufficient time delay for the COMP_OUT signal. Enable inputs are provided on both the voltage divider and the comparator.

The impact of a lower word line voltage on the memory array circuit is that the level of drive to the cells of the memory array is weaker. In other words, the read access time of the memory array is slightly longer. Since the comparator trips before the supply voltage reaches its full value, the additional access time (which is on the order of nanoseconds) for the first read cycle is a don't care because the data will be available before the supply voltage reaches full value. In the event the memory array circuit includes a sense amplifier which includes a latch, the timing of the self timed latch circuitry should track the level of the word line signal. In other words, the read access time is longer with a lower word line level. In addition, the self timed latch should clock at a later time also. The latch will clock data at a later time if the source for the self timed clock circuitry is the word line signal itself which is at a weaker level of drive. Thus, for latched designs, the slightly slower first read access, which occurs at a word line signal level below its full scale value, is compensated by a longer clock allowing the timing of the latch to track the access time of the memory array.

Address transition detection circuitry 36 is similar to address transition detection circuitry 12, 14 (FIG. 1). However, only a low to high transition from the output of the comparator will generate the FRC_TRIGGER output signal from the first read cycle circuitry 10. The FRC_TRIGGER signal subsequently initiates the generation of memory read cycle clock signals from clock chain circuitry 16 (FIG. 1).

As described previously, the voltage reference signal is preferably a bandgap reference source. Any other relatively stable voltage source can also be used as the reference voltage. Until the reference voltage achieves its final steady state value, the first read cycle circuitry should not be allowed to operate. If the first read cycle circuitry were allowed to operate before the voltage reference has reached its steady state value, the data output from the memory circuit might not be valid. Thus, included is enable circuitry 34 which functions to clamp the output of the comparator, COMP_OUT, to ground until the reference voltage has reached its stable operating voltage. The V_REF_VALID signal is input to the enable circuitry and indicates when the reference voltage is valid. Once the valid indication is received, enable circuitry releases the output of the comparator allowing it to go high when the word line voltage reaches a high enough level to cause the output of the voltage divider to trip the comparator.

It is important to note that the present invention is not limited by the ramp rate of the supply voltage. Since the present invention only triggers an initial read cycle once the reference voltage V_REF is valid (i.e., V_REF_VALID). Thus, the present invention is not dependent on the ramping of the supply voltage. In addition, the present invention allows the initial read cycle to be triggered before the supply voltage reaches its full value. This is achieved by the delay through the sense amp delay circuit 23 (FIG. 1) tracking the signal development time in the array 24 in accordance with the lower voltage level of the word line, V_WL.

Figure 3:
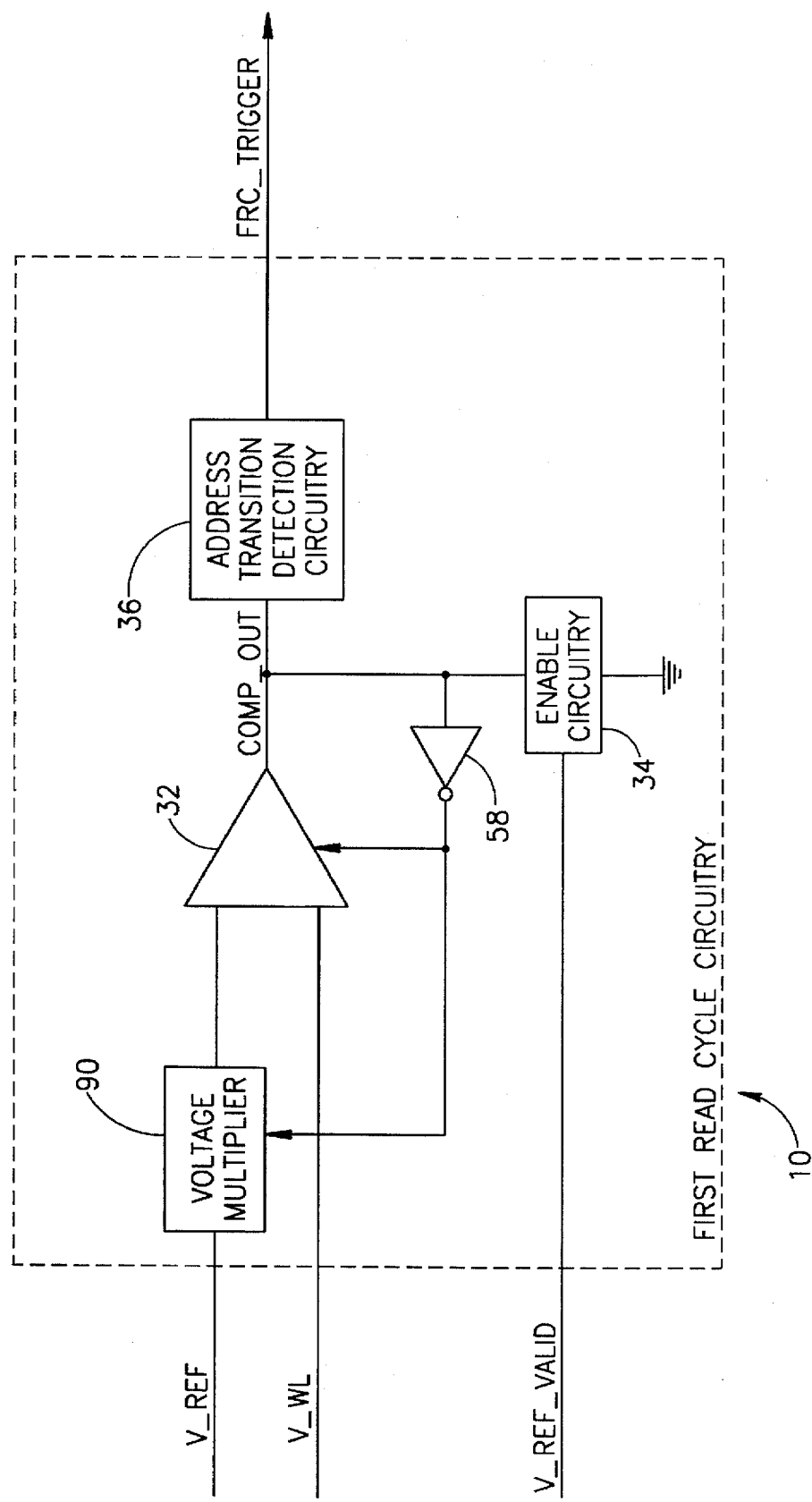
FIG. 3 is a high level functional block diagram illustrating an alternative first read cycle circuitry constructed in accordance with a preferred embodiment of the present invention.

A high level functional block diagram illustrating an alternative first read cycle circuitry constructed in accordance with a preferred embodiment of the present invention is shown in FIG. 3. This embodiment is similar in concept to the embodiment shown in FIG. 2. Here, rather than divide the word line signal, the reference voltage is multiplied instead by voltage multiplier 90. The net effect, however, is the same in that the comparator triggers when the word line voltage reaches a predetermined value relative to the reference voltage. The remainder of the circuit in FIG. 3 functions similarly to that of FIG. 2. Voltage multiplier 90 comprises enable circuitry to allow it to be shutdown after comparator 32 triggers.

Figure 4:
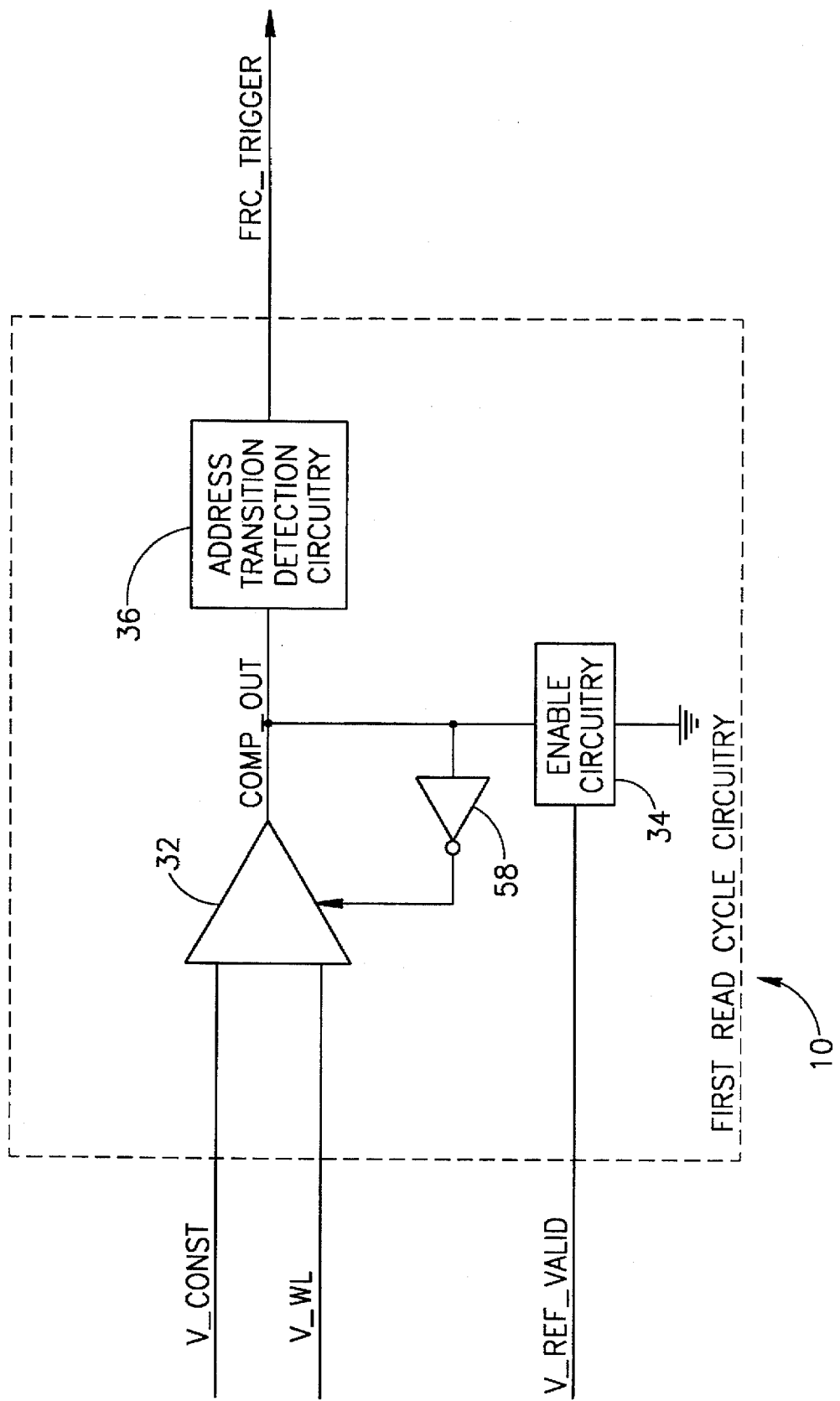
FIG. 4 is a high level functional block diagram illustrating another alternative first read cycle circuitry constructed in accordance with a preferred embodiment of the present invention.

A high level functional block diagram illustrating another alternative first read cycle circuitry constructed in accordance with a preferred embodiment of the present invention is shown in FIG. 4. This embodiment is also similar in concept to the embodiment shown in FIG. 2. In this embodiment, rather than divide the word line signal, the reference voltage is replaced with a constant voltage labeled V_CONST. The V_CONST voltage acts as a reference voltage and is preferably derived from the stable reference voltage V_REF. The net effect, however, is the same in that the comparator triggers when the word line voltage reaches a predetermined value relative to the reference voltage. The remainder of the circuit in FIG. 4 functions similarly to that of FIG. 2.

Figure 5:
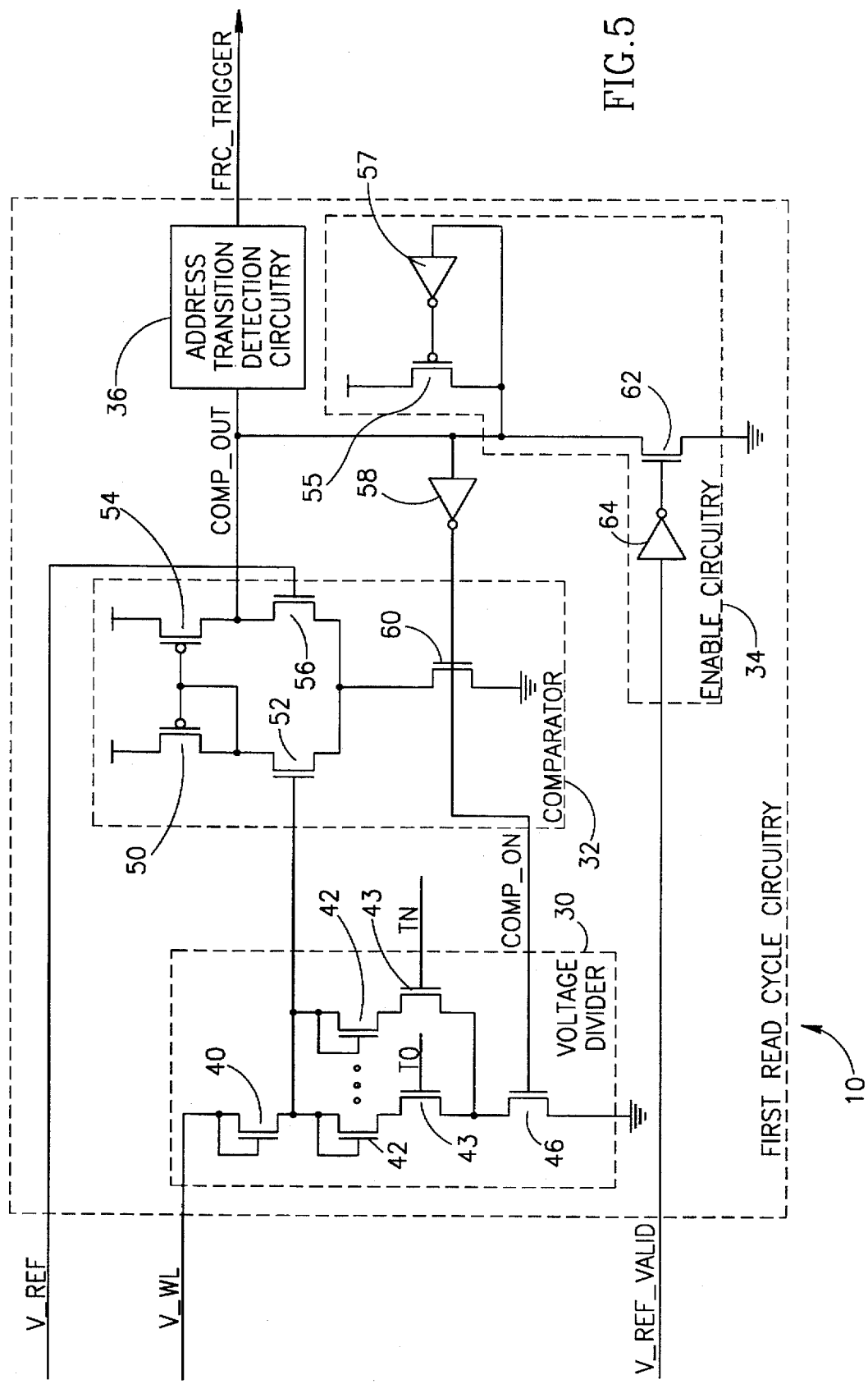
FIG. 5 is a detailed schematic diagram illustrating the first read cycle circuitry of the present invention.

A detailed schematic diagram illustrating the first read cycle circuitry of the present invention is shown in FIG. 5. Voltage divider 30 comprises n-channel transistor 40, one or more n-channel programmable trimming transistors 42 and one or more n-channel transistors 43. Programmable trimming transistors 42 allow the output voltage from the voltage divider to be accurately trimmed to the appropriate level. During manufacture, signals T0 to TN are applied to trimming transistors 43. Each transistor 43 that is turned on functions to insert its corresponding trimming transistor 42 into the circuit. Of those transistors 43 that remain off, their corresponding trimming transistors 42 also remain off and do not become part of the circuit. N-channel transistor 46 functions as an enable, effectively disabling the voltage divider when the enable signal, COMP_ON, is low.

Comparator 32 comprises p-channel transistors 50, 54 and n-channel transistors 52, 56. The output of the voltage divider is input to the gate of transistor 52, forming one of the two inputs to the comparator. The second input to the comparator is the V_REF signal which is input to the gate of transistor 56. The output of the comparator, COMP_OUT, is input to address transition detection circuitry 36 and inverter 58. Similar to voltage divider 30, comparator 32 also comprises an enable transistor 60 which effectively disables the comparator while COMP_ON is high.

Enable circuitry 43 comprises inverter 64, n-channel transistor 62, p-channel transistor 55 and inverter 57. Transistor 62 functions to clamp the output of the comparator, COMP_OUT, while the V_REF_VALID signal is low. Once the V_REF_VALID signal goes active high, transistor 62 shuts off and allows the COMP_OUT signal to swing high or low. P-channel transistor 55 and inverter 57 function to pull the COMP_OUT signal high after the comparator 32 and voltage divider 30 are disabled. P-channel transistor is off during the time enable circuitry 34 clamps the COMP_OUT signal low and during the time the comparator is enabled but while its output remains low. The moment COMP_OUT goes high, transistor 55 turns on and clamps COMP_OUT high. COMP_OUT must be clamped high since inverter 58 functions to disable the comparator and voltage multiplier upon COMP_OUT going high initially.

Figure 6:
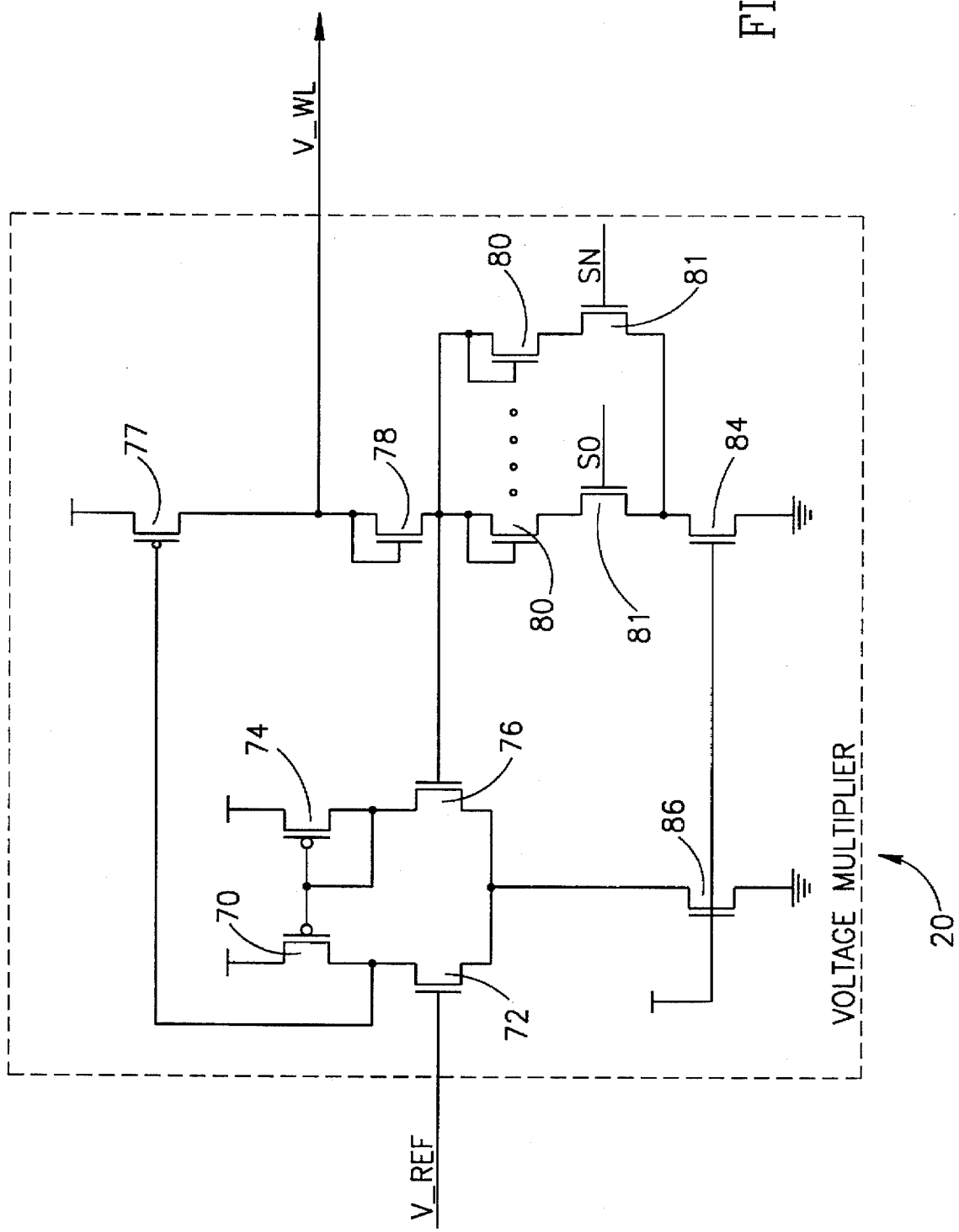
FIG. 6 is a detailed schematic diagram illustrating the voltage multiplier.

A detailed schematic diagram illustrating the voltage multiplier is shown in FIG. 6. The multiplier comprises p-channel 70, 74, n-channel transistors 72, 76, p-channel transistor 77, n-channel transistors 78, 84, one or more n-channel programmable trimming transistors 80 and one or more n-channel transistors 81. Enable transistors 86, 84 are tied to the supply voltage. Thus, the output of the multiplier, V_WL, is always valid. The input to the multiplier V_REF is input to the gate of transistor 72. To generate an accurate V_WL signal 4.5 times the input signal V_REF, one or more programmable trimming transistors 82 are provided. These transistors are trimmed at the time of manufacture so as to precisely generate a V_WL of 4.5 V.

Programmable trimming transistors 80 allow the output voltage from the voltage multiplier to be accurately trimmed to the appropriate level. During manufacture, signals S0 to SN are applied to trimming transistors 81. Each transistor 81 that is turned on functions to insert its corresponding trimming transistor 80 into the circuit. Of those transistors 81 that remain off, their corresponding trimming transistors 80 also remain off and do not become part of the circuit. In addition, there is a matching of the comparator 32 (FIG. 5) and the voltage multiplier 20. The size of the trimming transistors 42 in the comparator and the trimming transistors 80 in the voltage multiplier are designed to be the same to allow both to track in temperature, etc. In a preferred embodiment, the signals T0 through TN correspond to the signals S0 through SN (i.e., T0 equals S1, T1 equals S1, etc.) in order to achieve optimum tracking of the comparator and the voltage multiplier.

Alternatively, the word line signal, which functions as the power supply for the word line signal fed to the memory array, can be provided by an external source (i.e., supply voltage or clamped level) or by an internal source (i.e., charge pumped level). For example, the supply voltage to the memory device can be used as the source of the word line signal.

Figure 7:
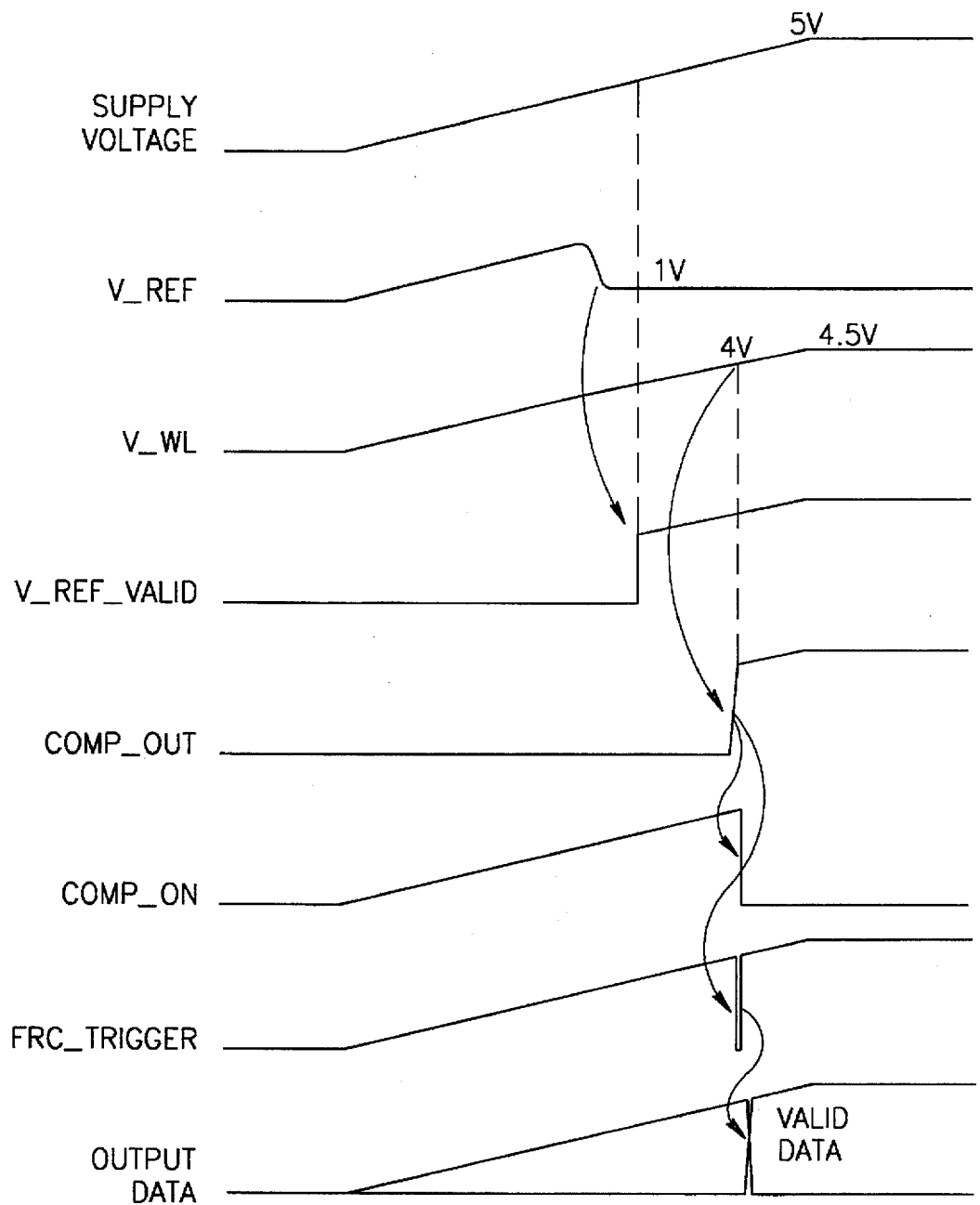
FIG. 7 is a timing diagram illustrating the timing relationships between signals at various points within the first read cycle circuitry.

To aid in the understanding of the principles of the present invention, a timing diagram illustrating the timing relationships between signals at various points within the first read cycle circuit is shown in FIG. 7. The signals illustrated in FIG. 7 are described with reference to FIGS. 1 and 2. The supply voltage is shown going form 0 V at initial power up to its final value of 5 V. The V_REF signal ramps up from 0 V to a steady state level of approximately 1 V. Once the steady state voltage level is reached, the V_REF_VALID signal goes high, which is the enable signal for the comparator and the voltage divider. Note that a read cycle is not tripped prematurely by the jump start peak in the V_REF signal. This is due to the comparator output being clamped until the V_REF_VALID signal indicates a valid V_REF, which does not occur until after the jump start peak.

The output of the voltage multiplier, V_WL, ramps up with the supply voltage. Once the V_WL voltage reaches a high enough level, the comparator trips and COMP_OUT goes high. COMP_OUT going high causes COMP_ON to drop low which functions to disable the comparator and the voltage divider. The low to high transition of the COMP_OUT signal causes FRC_TRIGGER to transition low and then high. This, in turn, triggers the clock chain circuitry 16 to initiate a read cycle in the memory circuit. Once the read access time of the memory has elapsed, valid data is output from the memory device.

While the invention has been described with respect to a limited number of embodiments, it will be appreciated that many various, modifications and other applications of the invention may be made.

What is claimed is:

1. In a latched memory array circuit utilizing a sense amplifier delay circuit, a supply voltage, a reference voltage, a reference voltage valid signal, a word line signal and clock chain circuitry, a first read cycle circuit for initiating a read cycle within said memory array circuit upon the initial application of power by generating an output signal active to trigger said clock chain circuitry to initiate said read cycle within said memory array circuit, said first read cycle circuit comprising:

a comparator having first and second inputs and an output, said reference voltage coupled to said first input, said word line signal coupled to said second input, said comparator being enabled when said reference voltage valid signal goes active, said output of said comparator being tripped when said word line signal exceeds said reference voltage;

clocking means having an input and an output, said output of said comparator coupled to said input of said clocking means, said output of said clocking means coupled to said clock chain circuitry;

wherein said reference voltage is chosen such that the tripping of said comparator occurs before said word line signal reaches its full value, said word line signal input to said sense amplifier delay circuit, said sense amplifier delay circuit delaying the availability of output data from said memory array circuit in accordance with the level of said word line signal; and wherein the tripping of said comparator is not dependent on the ramping up of said supply voltage and causes said clocking means to trigger said clock chain circuitry to initiate said read cycle of said memory array circuit thus providing valid data.

2. The first read cycle circuit according to claim 1, further comprising enable circuitry coupled to said output of said comparator, said enable circuitry disabling said output of said comparator while said reference voltage valid signal indicates that said reference voltage is invalid.

3. The first read cycle circuit according to claim 1, wherein said comparator comprises an enable circuit, whereby the tripping of said comparator causes the disablement of said comparator after a predetermined time delay, thus reducing power consumption of said circuit.

4. The first read cycle circuit according to claim 1, wherein said clocking means comprises address transition detection circuitry.

5. In a memory array circuit utilizing a sense amplifier delay circuit, a supply voltage, a reference voltage, a reference voltage valid signal, a word line signal and clock chain circuitry, a first read cycle circuit for initiating a read cycle within said memory array circuit upon the initial application of power by generating an output signal active to trigger said clock chain circuitry to initiate said read cycle within said memory array circuit, said first read cycle circuit comprising:

a voltage divider having an input and an output, said word line signal coupled to said input;

a comparator having first and second inputs and an output, said reference voltage coupled to said first input, said output of said voltage divider coupled to said second input, said comparator being enabled when said reference voltage valid signal goes active, said output of said comparator being tripped when said output of said voltage divider exceeds said reference voltage;

clock means having an input and an output, said output of said comparator coupled to said input of said clock means, said output of said clock means coupled to said clock chain circuitry;

wherein said voltage divider is suitable tuned such that the tripping of said comparator occurs before said word line signal reaches its full value, said word line signal input to said sense amplifier delay circuit, said sense amplifier delay circuit delaying the availability of output data from said memory array circuit in accordance with the level of said word line signal; and wherein the tripping of said comparator is not dependent on the ramping up of said supply voltage and causes said clock means to trigger said clock chain circuitry to initiate said read cycle of said memory array circuit thus providing valid data.

6. The memory array circuit according to claim 5, wherein said reference voltage is a bandgap voltage stable against variations in said supply voltage and temperature.

7. The first read cycle circuit according to claim 5, further comprising enable circuitry coupled to said output of said comparator, said enable circuitry disabling said output of said comparator while said reference voltage valid signal indicates that said reference voltage is invalid.

8. The first read cycle circuit according to claim 5, wherein said comparator comprises an enable circuit, whereby the tripping of said comparator causes the disablement of said comparator after a predetermined time delay, thus reducing power consumption of said first read cycle circuit.

9. The first read cycle circuit according to claim 5, wherein said voltage divider comprises an enable circuit, whereby the tripping of said comparator causes the disablement of said voltage divider after a predetermined time delay, thus reducing power consumption of said first read cycle circuit.

10. The first read cycle circuit according to claim 5, wherein said clock means comprises address transition detection circuitry.

11. In a memory array circuit utilizing a sense amplifier delay circuit, a supply voltage, a reference voltage, a reference voltage valid signal, a word line signal and clock chain circuitry, a first read cycle circuit for initiating a read cycle within said memory array circuit upon the initial application of power by generating an output signal active to trigger said clock chain circuitry to initiate said read cycle within said memory array circuit, said first read cycle circuit comprising:

a multiplier having an input and an output, said input of said multiplier coupled to said reference voltage;

a comparator having first and second inputs and an output, said word line signal coupled to said first input of said comparator, said output of said multiplier coupled to said second input of said comparator, said comparator being enabled when said reference voltage valid signal goes active, said output of said comparator being tripped when said word line signal exceeds said output of said multiplier;

clock means having an input and an output, said output of said comparator coupled to said input of said clock means, said output of said clock means coupled to said clock chain circuitry;

wherein said multiplier is suitable tuned such that the tripping of said comparator occurs before said word line signal reaches its full value, said word line signal input to said sense amplifier delay circuit, said sense amplifier delay circuit delaying the availability of output data from said memory array circuit in accordance with the level of said word line signal; and wherein the tripping of said comparator is not dependent on the ramping up of said supply voltage and causes said clock means to trigger said clock chain circuitry to initiate said read cycle of said memory array circuit thus providing valid data.

12. The memory array circuit according to claim 11, wherein said reference voltage is a bandgap voltage stable against variations in said supply voltage and temperature.

13. The first read cycle circuit according to claim 11, further comprising enable circuitry coupled to said output of said comparator, said enable circuitry disabling said output of said comparator while said reference voltage valid signal indicates that said reference voltage is invalid.

14. The first read cycle circuit according to claim 11, wherein said comparator comprises an enable circuit, whereby the tripping of said comparator causes the disablement of said comparator after a predetermined time delay, thus reducing power consumption of said first read cycle circuit.

15. The first read cycle circuit according to claim 11, wherein said multiplier comprises an enable circuit, whereby the tripping of said comparator causes the disablement of said multiplier after a predetermined time delay, thus reducing power consumption of said first read cycle circuit.

16. The first read cycle circuit according to claim 11, wherein said clock means comprises address transition detection circuitry.

17. In a memory array circuit utilizing a sense amplifier delay circuit, a supply voltage, a reference voltage, a reference voltage valid signal, a word line signal and clock chain circuitry, a method of initiating a read cycle within said memory array circuit upon the initial application of power, said method comprising the steps of:

comparing said reference voltage to said word line signal once said reference voltage valid signal goes active;

upon said word line signal exceeding said reference voltage, generating an output signal active to trigger said clock chain circuitry to initiate said read cycle within said memory array circuit;

wherein said step of generating is not dependent on the ramping up of said supply voltage; and wherein said sense amplifier delay circuit delays the availability of output data from said memory array circuit in accordance with the level of said word line signal.

18. In a memory array circuit utilizing a sense amplifier delay circuit, a supply voltage, a reference voltage, a reference voltage valid signal, a word line signal and clock chain circuitry, a method of initiating a read cycle within said memory array circuit upon the initial application of power, said method comprising the steps of:

dividing said word line signal;

comparing said reference voltage to said divided word line signal once said reference voltage valid signal goes active;

upon said divided word line signal exceeding said reference voltage, generating an output signal active to trigger said clock chain circuitry to initiate said read cycle within said memory array circuit;

wherein said step of generating is not dependent on the ramping up of said supply voltage; and wherein said sense amplifier delay circuit delays the availability of output data from said memory array circuit in accordance with the level of said word line signal.

19. The method according to claim 18, wherein said reference voltage is a bandgap voltage stable against variations in said supply voltage and temperature.

20. In a memory array circuit utilizing a sense amplifier delay circuit, a supply voltage, a reference voltage, a reference voltage valid signal, a word line signal and clock chain circuitry, a method of initiating a read cycle within said memory array circuit upon the initial application of power, said method comprising the steps of:

multiplying said reference voltage;

comparing said multiplied reference voltage to said word line signal once said reference voltage valid signal goes active;

upon said word line signal exceeding said multiplied reference voltage, generating an output signal active to trigger said clock chain circuitry to initiate said read cycle within said memory array circuit;

wherein said step of generating is not dependent on the ramping up of said supply voltage; and wherein said sense amplifier delay circuit delays the availability of output data from said memory array circuit in accordance with the level of said word line signal.

21. The method according to claim 20, wherein said reference voltage is a bandgap voltage stable against variations in said supply voltage and temperature.

* * * * *